(12) United States Patent
Mather et al.

(10) Patent No.: US 7,977,941 B2
(45) Date of Patent: Jul. 12, 2011

(54) MAGNETIC FIELD SENSING DEVICE

(75) Inventors: Phillip G. Mather, Maricopa, AZ (US);
Jon M. Slaughter, Tempe, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 240 days.

(21) Appl. No.: 12/392,638

(22) Filed: Feb. 25, 2009

(65) Prior Publication Data
US 2010/0213933 A1 Aug. 26, 2010

(51) Int. Cl.
*G01R 33/02* (2006.01)
(52) U.S. Cl. .......................... 324/252; 324/244
(58) Field of Classification Search .................. 324/244, 324/252
See application file for complete search history.

(56) References Cited

U.S. PATENT DOCUMENTS

| | | |
|---|---|---|
| 5,247,278 A | 9/1993 | Pant et al. |
| 5,583,436 A | 12/1996 | Van De Walle et al. |
| 2005/0088786 A1 | 4/2005 | Gill |
| 2006/0007728 A1 | 1/2006 | Sundstrom |
| 2006/0056217 A1 | 3/2006 | Takizawa |
| 2007/0026558 A1 | 2/2007 | Chung et al. |

OTHER PUBLICATIONS

International Search Report for PCT/US10/023444 mailed Apr. 13, 2010.

*Primary Examiner* — Reena Aurora
(74) *Attorney, Agent, or Firm* — Ingrassia Fisher & Lorenz, PC

(57) ABSTRACT

A magnetic field sensing device for determining the strength of a magnetic field, includes four magnetic tunnel junction elements or element arrays (100) configured as a bridge (200). A current source is coupled to a current line (116) disposed near each of the four magnetic tunnel junction elements (100) for selectively supplying temporally spaced first and second currents. Sampling circuitry (412, 414) coupled to the current source samples the bridge output during the first and second currents and determines the value of the magnetic field from the difference of the first and second values. A method for sensing the magnetic field includes supplying a first current to the current line (116), supplying a second current the current line (116), sampling the value at the output for each of the first and second currents, determining the difference between the sampled values during each of the first and second currents, and determining a measured magnetic field based on the determined difference.

19 Claims, 2 Drawing Sheets

US 7,977,941 B2

MAGNETIC FIELD SENSING DEVICE

FIELD OF THE INVENTION

The present invention generally relates to a magnetic field sensing device and more particularly to a magnetic tunnel junction device capable of accurately sensing small magnetic fields.

BACKGROUND OF THE INVENTION

Sensors are widely used in modern systems to measure or detect physical parameters, such as position, motion, force, acceleration, temperature, pressure, etc. While a variety of different sensor types exist for measuring these and other parameters, they all suffer from various limitations. For example, inexpensive low field sensors, such as those used in an electronic compass and other similar magnetic sensing applications, generally comprise anisotropic magnetoresistance (AMR) based devices. In order to arrive at the required sensitivity and reasonable resistances that mesh well with CMOS, the sensing units of such sensors are generally in the order of square millimeters in size. Furthermore, large reset pulses from bulky coils of approximately 10 mA are typically required. For mobile applications, such AMR sensor configurations are too costly, in terms of expense, circuit area, and power consumption.

Other types of sensors, such as magnetic tunnel junction (MTJ) sensors and giant magnetoresistance (GMR) sensors, have been used to provide smaller profile sensors, but such sensors have their own concerns, such as inadequate sensitivity and being effected by temperature changes. To address these concerns, MTJ, GMR, and AMR sensors have been employed in a Wheatstone bridge structure to increase sensitivity and to eliminate temperature dependent resistance changes. For minimal sensor size and cost, MTJ or GMR elements are preferred.

As a result of the manufacturing process variations, these low field Wheatstone bridge based magnetic sensors may exhibit a small yet variable residual offset. Temperature shifts, mechanical stress, and the aging of the device may exacerbate this offset. Furthermore, conventional magnetic sensors have a sensitivity built into the device by factors such as sense layer thickness, shape, and flux concentrator geometry, thereby limiting useful range and linear range.

Accordingly, it is desirable to provide an inexpensive low field sensor that provides resolution for low field measurements, is CMOS compatible, minimizes offsets, and expands dynamic range. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A magnetic field sensing device for determining the strength of a magnetic field includes at least one sensing element including a ferromagnetic sense layer and having at least one sensing element output terminal. At least one current line is disposed near the at least one sensing element. A current source supplies a variable current to the at least one current line to adjust the sensitivity of the sensor and measuring circuitry is coupled to a sensing element output terminal for measuring the output for the variable current and determining the strength of the magnetic field.

Another embodiment of the magnetic field sensing device includes four magnetic tunnel junction elements configured as a Wheatstone bridge. A current source is coupled to a current line disposed near each of the four magnetic tunnel junction sense elements for selectively supplying temporally spaced first and second currents. Sampling circuitry coupled to bridge output signal samples the bridge signal at each of the first and second currents and determines the value of the magnetic field from the difference of the first and second samples. A method for sensing the magnetic field includes supplying a first current to the current line, supplying a second current to the current line, sampling the value at the bridge output for each of the first and second currents, determining the difference between the sampling of the output during the first and second currents, and determining a measured magnetic field based on the determined difference.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
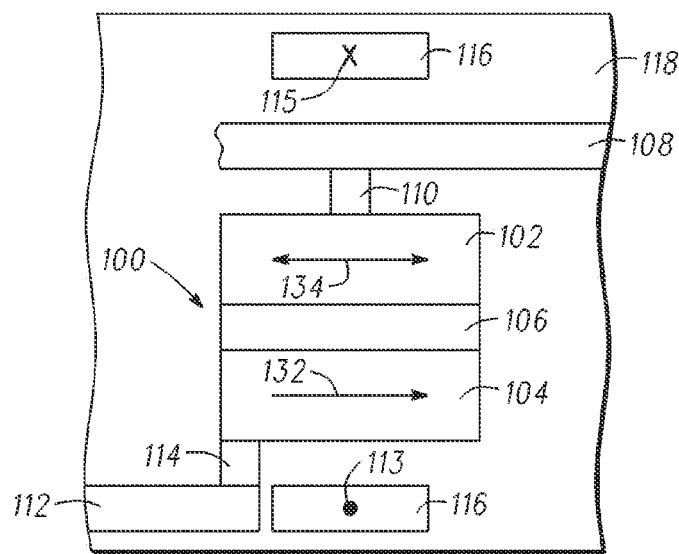
FIG. 1 is a cross section of a magnetic tunnel junction device in accordance with an exemplary embodiment.

The following detailed description of the invention is merely exemplary in nature and is not intended to limit the invention or the application and uses of the invention. Furthermore, there is no intention to be bound by any theory presented in the preceding background of the invention or the following detailed description of the invention.

Small footprint magnetic sensors typically are laid out in a Wheatstone bridge configuration, where a precise balance between the resistances of the circuit elements must be maintained for the bridge to produce a minimal response in a zero magnetic field. Any nonzero response (bridge offset) present from the manufacturing process must be calibrated or nulled out to produce signals that are free from error. These offsets may shift over the lifetime of the part, in response to temperature changes, mechanical stresses, or other effects. In a compass application with a typical field response of 1.0 to 5.0 mV/V/Oe, maintaining an accuracy of less than one degree implies that shifts in offset of less than 10 μV must be removed or calibrated out of the error signal. This is accomplished as described herein by a current carrying line disposed in close proximity or contiguously to each of the four ferromagnetic tunnel junction sense elements of the Wheatstone bridge. Adjusting the variable stabilization current through this current carrying line changes the sensor response to an external magnetic field. The sensor output is sampled at two different temporally spaced values of stabilization current and these two values are subtracted from one another to reduce or eliminate offset and 1/f noise present through sense element resistance imbalances. Both the offset and the variation in sensor output in the absence of a magnetic field (1/f noise) can be viewed as an effective low frequency signal. When the sampling circuitry is operated at a frequency which is higher than this unwanted (and possibly time varying) signal, the value (strength) of the magnetic field together with the undesirable low frequency signal is sensed with a high sensitivity sensor, and then both are sampled again a short while later with a low sensitivity sensor. A subsequent subtraction of the two values will produce a signal that is free of direct current (DC) and time varying offsets (1/f noise) which are present at frequencies below the sampling frequency. Current values and duty cycle are chosen to maximize signal to noise ratio and minimize power consumption (voltage) requirements.

Either in conjunction with the technique outlined above, or in a separate DC measurement application, there may be field values for which the sensor response is saturated for one or both of the stabilization current values. In this case, the stabilization current may be increased in order to increase the overall $H_k$ of the sensing bit and to move the sensor response out of saturation. The controlling circuitry may detect such a saturation condition, apply the increased stabilization current values, and subsequent downstream circuitry may be notified to scale down the sensitivity calibration. Hence through adjustment of the stabilization current values, a larger dynamic range can be accommodated without losing resolution for the low field response than would be possible if the stabilization current were fixed at one or two values for DC and Correlated Double Sampling (CDS) measurement.

In another embodiment, the reference layer may consist of an unpinned synthetic antiferromagnetic (SAF) layer instead of the conventional pinned SAF reference layer. This unpinned SAF may be subjected to a toggle pulse sequence from two orthogonal current lines routed in close proximity above and below the sense layer in order to reverse its direction. In such a case, the two current lines will be oriented at approximately 45 degrees with respect to the reference layer. A first toggle current pulse will pass along the first current line, and overlapping with this pulse, a second toggle current pulse will pass along the second current line. The first toggle current pulse starts before the second pulse, and the second toggle current pulse ends after the first pulse finishes. As a result, the sensor reference layer is rotated by 180 degrees before and after the toggle pulse sequence. The sensor output is sampled at both reference layer orientations, and the two values are subtracted from one another. In this case, the first measurement produces the bridge response with a first signal value and the offset+low frequency term. The response is then sampled again for the opposite orientation of the reference layer, yielding a second signal value and the same offset+low frequency term. Due to the nature of magnetic tunnel junctions, the two signal values will be opposite in sign but equal in magnitude. The subtraction then yields twice the signal value with the offset removed.

Referring to FIG. 1, an exemplary magnetic tunnel device 100 is formed within a dielectric material 118 and includes a ferromagnetic sense layer 102 and a fixed ferromagnetic region 104 separated by a tunnel barrier 106. The sense layer 102 is connected to a first conductive line 108 by a via 110, and the fixed region 104 is connected to a second conductive line 112 by a via 114. A current carrying line 116 is positioned on opposed sides of the magnetic tunnel device 100 near both the sensor layer 102 and the fixed region 104. The direction of the current 115 is represented by the X as going into the page and by the dot 113 as coming from the page, though the direction could be reversed. Although the current carrying line 116 is shown to be near both the sense layer 102 and the fixed region 104 in accordance with the preferred embodiment, it should be understood that it may be positioned near only one of the sense layer 102 and the fixed region 104. In the case of the unpinned SAF embodiment, the current carrying line may consist of two perpendicular lines, one above and one below the SAF layer, that are not interconnected. In this case, the current during measurement will be a single value flowing through one of the lines, in such a direction so that the projection of the resultant field is along either the easy or the hard axes of the sense layer. These current lines are preferably oriented 45 degrees to the reference layer pinning direction. In order to switch the direction of the reference layer, a toggle sequence of two pulses is sent down each current line. The first of these pulses starts before the second, and there is a temporal overlap of at least a 3.0 nanoseconds, after which the first pulse is removed. The second pulse is held for slightly longer, and then it is removed as well.

The fixed magnetic region 104 is well known in the art, and typically includes a fixed layer (not shown) disposed between the tunnel barrier and an anti-ferromagnetic coupling spacer layer (not shown). The anti-ferromagnetic coupling spacer layer is formed from any suitable nonmagnetic material, for example, at least one of the elements Ru, Os, Re, Cr, Rh, Cu, or their combinations. A pinned layer (not shown) is disposed between the anti-ferromagnetic coupling spacer layer and an optional pinning layer. The pinning layer is omitted in the unpinned SAF embodiment. The sense layer 102 and the fixed layer may be formed from any suitable ferromagnetic material, such as at least one of the elements Ni, Fe, Co, B, or their alloys as well as so-called half-metallic ferromagnets such as NiMnSb, PtMnSb, $Fe_3O_4$, or $CrO_2$. The tunnel barrier 106 may be insulator materials such as AlOx, MgOx, RuOx, HfOx, ZrOx, TiOx, or the nitrides and oxidinitrides of these elements.

In the exemplary embodiment, the dielectric material 118 may be silicon oxide, silicon nitride (SiN), silicon oxynitride (SiON), a polyimide, or combinations thereof. The conductive lines 108, 112, vias 110, 114, and current carrying line 116 are preferably copper, but it will be understood that they may be other materials such as tantalum, tantalum nitride, silver, gold, aluminum, platinum, or another suitable conductive material.

The ferromagnetic fixed and pinned layers each have a magnetic moment vector that are usually held anti-parallel by the anti-ferromagnetic coupling spacer layer resulting in a resultant magnetic moment vector 132 that is not free to rotate and is used as a reference layer. The sense layer 102 has a magnetic moment vector 134 that is free to rotate in the presence of a magnetic field. In the absence of an applied field, magnetic moment vector 134 is oriented along the anisotropy easy-axis of the sense layer.

During fabrication of the magnetic tunnel device 100, each succeeding layer is deposited or otherwise formed in sequence and each magnetic tunnel device 100 may be defined by selective deposition, photolithography processing, etching, etc. using any of the techniques known in the semiconductor industry. During deposition of at least the ferromagnetic sensor 102 and fixed region 104, a magnetic field is provided to set a preferred anisotropy easy-axis (induced intrinsic anisotropy). The provided magnetic field creates a preferred anisotropy easy-axis for magnetic moment vectors 132, 134. In addition to intrinsic anisotropy, sense elements having aspect ratios greater than one may have a shape anisotropy, and the combination of this shape and the intrinsic anisotropy define an easy axis that is preferably parallel to a long axis of the sense element. This easy axis may also be selected to be at about a 30 to 90 degree angle, with the reference magnetization 132. In the bridge embodiment with no flux concentrators, this is preferably at about a 45-degree angle.

Figure 2:
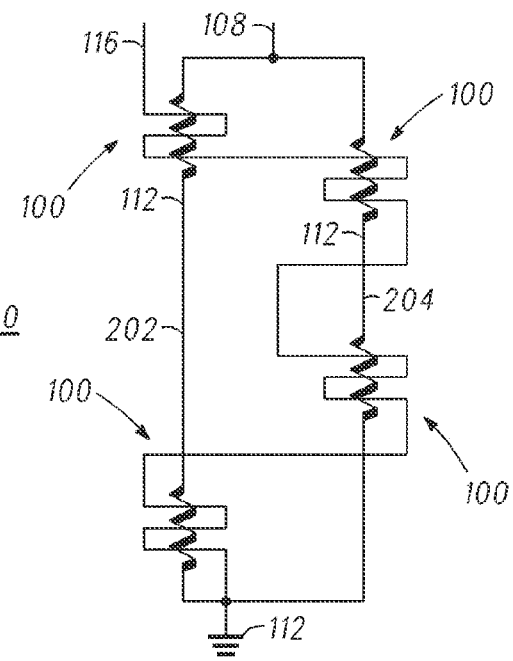
FIG. 2 is a Wheatstone bridge including four of the magnetic tunnel junction devices of FIG. 1.

Four of the magnetic tunnel sense elements 100 are combined to form a Wheatstone bridge 200 (FIG. 2). Each resistor represented in the magnetic tunnel devices 100 may be an array of magnetic tunnel junction sense elements for improved reliability and signal/noise ratio. The direction of current flow through the sense elements is preserved in each of the legs so as one proceeds from the voltage input 108 along either path of the bridge, the current flows either from the top to the bottom or the bottom to the top of the magnetic tunnel junction stack. The current carrying line 116 is positioned to provide current near each of the four magnetic tunnel devices 100. Though the current carrying line 116 may be disposed on only one side of the magnetic tunnel devices 100, it preferably is also disposed on the opposed side thereof, thereby doubling the effective field applied for a given current. For example, FIG. 1 depicts the current going into the page (represented by an X), and coming from the page (represented by a dot). FIG. 2 depicts the opposed current direction by the zigzag fashion of the current carrying line 116 across each magnetic tunnel device 100. The bridge is supplied with a constant voltage bias between voltage source terminals 108 and 112. The sensor response is differentially measured across the midsection of the bridge at nodes, or outputs, 202 and 204. While the correlated double sampling described herein may be applied to various bridge orientations, one example may be found in U.S. patent application Ser. No. 12/055,482, assigned to the assignee of the present application.

Figure 3:
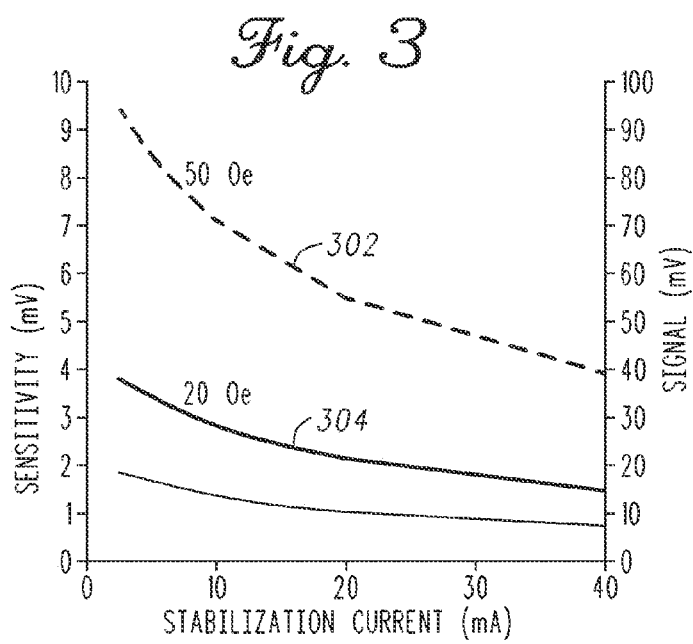
FIG. 3 is a graph of the sensitivity versus a stabilization current for the Wheatstone bridge of FIG. 2.

The graph of FIG. 3 illustrates the sensor response (sensitivity) as a function of the stabilization current flowing through the current carrying line 116. If the sensor output is being sensed with a 12 bit analog to digital convertor (ADC) with a resolution of 0.01 mV, the 50 Oe signal 302 will saturate the response for a stabilization current below about 40 mA. However, at 40 mA stabilization current only 11 bits are being used to represent the 20 Oe field 304, so the resolution at that field level is not as high as possible. Additionally, the sense elements response will saturate earlier for low stabilization current, and hence the measurable field range will decrease with stabilization current. For optimum response, the circuitry (not shown) controlling the magnetic sense circuit will detect when a saturation (resolution limiting) point is being approached and switch over to a higher (lower) stabilization current, and provide the appropriate scale factor conversion of the output signal to the measured field. In another embodiment, the stabilization current dependent field response may be detected with by applying two differing stabilization currents, and the field value can be determined by subtracting the two sampled values.

Figure 4:
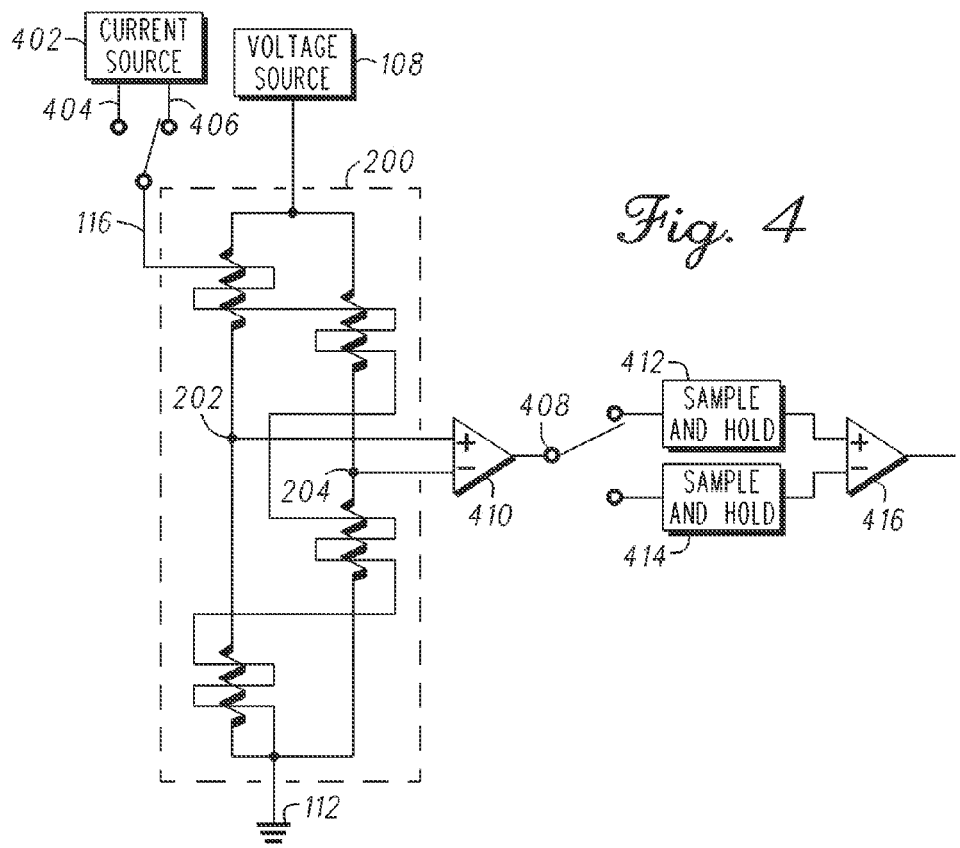
FIG. 4 is a block diagram of the magnetic field sensing device in accordance with an exemplary embodiment.
Figure 5:
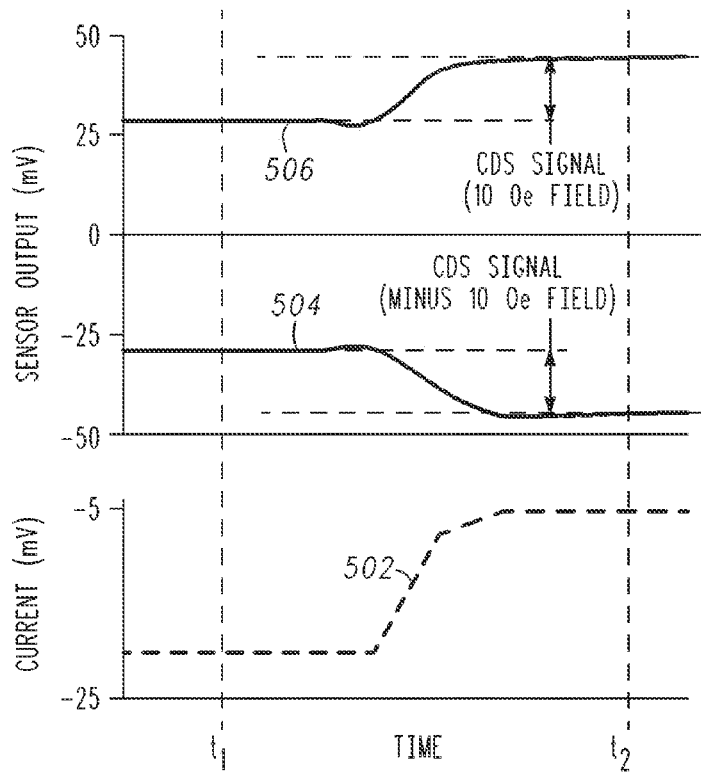
FIG. 5 is a graph of the output signal over time for the exemplary embodiment of FIG. 4.

Referring to FIG. 4, the stabilization current applied to the current carrying line 116 of the Wheatstone bridge 200 is switched between two preset values at inputs 404, 406 by a current source 402 and provided to output circuitry including amplifiers 410, 416 and sample and hold (S and H) circuits 412, 414. The output of the differential amplifier 410 (output terminal 408) is sampled at each value. These values are preferably about 2.5 mA and 20 mA, but are geometry dependent and may be adjusted for optimal power consumption. The corresponding values are held until both values are present utilizing well know S and H techniques. Preferably, the current value 502 (FIG. 5) is selected about 2 microseconds before each S and H circuits 412, 414 is selected, and each S and H circuit 412, 414 is disconnected about 0.5 microseconds before the current source is switched. The sensor response, e.g., 504 for a 10 Oe field or 506 for a −10 Oe field, is sampled at t1 and t2 (FIG. 5) and the resultant difference measured by differential amplifier 416 is used to determine the measured field value through the differential amplifier 420. This method has the advantage of subtracting out any offset that is present in the bridge response as it will be present in both signals. As the sampling frequency can be set to a high frequency value, limited only by sensor RC time constants, both signals can be taken quickly (100 KHz) and any low frequency noise will also be subtracted. This property becomes especially important for tunnel junction based magnetic sensors whose noise has strong 1/f characteristics with a corner at 1-10 KHz, where after the noise response transitions to frequency independent Johnson noise. As long as the sampling frequency is above the 1/f noise corner, the signal/noise ratio will be limited by Johnson noise only. This becomes quite useful where measurement of a low frequency or DC field is desired, as a means to shift the measurement into the quieter high frequency response region of the magnetic sensor. Additionally, for measurements of DC fields, generally the update rate is rather low (typically in the range of 10 Hz), so a brief measurement can result in a very low duty cycle, and reduce power consumption by 1000× or more. The stabilization current at the two values may be unipolar (20 mA, 5 mA), or bipolar (+5 mA, −5 mA or −5, +20 mA), but the unipolar design is preferred as there is better offset subtraction and it is simpler to implement in a circuit, and more tolerant to process variation in reference layer pinning. Alternatively or addition to the delays between switching of the current source and of the S and H, an RC filter may be used to suppress transients.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A sensor for sensing a magnetic field, comprising:
   at least one sensing element including a ferromagnetic sense layer and having at least one sensing element output terminal;
   a voltage source configured to supply a voltage across the sensing element;
   at least one current line contiguous to the at least one sensing element;
   a current source configured to supply a variable stabilization current, including a first current value and a second current value, to the at least one current line to adjust the sensitivity of the sensor; and
   measuring circuitry coupled to the at least one sensing element output terminal and configured to measure a first and a second output value for the first and second current values, respectively, and thereby determine the strength of the magnetic field and reduce an offset voltage and low frequency noise at the at least one sensing element output terminal.

2. The sensor of claim 1 wherein each of the at least one sensing element comprises an array of magnetic tunnel junction elements.

3. The sensor of claim 1 wherein the at least one current line is disposed contiguously on opposed sides of the at least one sensing element so that a current passing therethrough flows in two opposed directions on the opposed sides.

4. A sensor as in claim 1 wherein the at least one current line comprises:
two orthogonal current lines disposed near each sensing element; and
the measuring circuitry comprises:
sampling circuitry coupled between the at least one sensing element output terminal for sampling the output before and after a toggle pulse sequence is enacted with the first and second current lines.

5. The sensor of claim 4 wherein the sensing circuitry further comprises:
output circuitry coupled to the sampling circuitry for calculating the difference in the output values during the first and second currents and for producing a sensor output that represents the magnitude of the sensed magnetic field.

6. The sensor of claim 1 wherein the at least one sensing element comprises:
first, second, third, and fourth sensing elements configured as a Wheatstone bridge having a pair of voltage source terminals; and
the at least one sensing element output terminal comprises:
a pair of output terminals for supplying the output.

7. The sensor of claim 6 wherein each of the first, second, third, and fourth sensing elements comprise a first, second, third, and fourth magnetic tunnel junction array.

8. A method of sensing a magnetic field in a device including at least one sensing element including a ferromagnetic sense layer and having at least one sensing element output terminal, a voltage source configured to supply a voltage across the sensing element, and an input for supplying current to a current line disposed contiguous to the at least one sensing element, the method comprising:
supplying a first stabilization current to the current line;
sampling a first value at the sensing element output terminal while supplying the first stabilization current;
supplying a second stabilization current to the current line;
sampling a second value at the sensing element output terminal while supplying the second stabilization current;
determining a difference between the first and second values;
compensating for offset voltage and low frequency noise at the at least one sensing element output terminal; and
determining a measured magnetic field based on the difference.

9. The sensor of claim 8 herein each of the at least one sensing element comprises an array of magnetic tunnel junction elements and the current line is disposed contiguous to each of the magnetic tunnel junction elements.

10. The sensor of claim 8 wherein the at least one current line is disposed contiguously on opposed sides of the at least one sensing element and wherein the steps of supplying the first and second currents comprises passing the first and second currents in two opposed directions on the opposed sides.

11. A sensor as in claim 8 wherein the at least one current line comprises:
two orthogonal current lines disposed near the at least one sensing element;
wherein the steps of supplying the first and second currents comprises:
supplying a toggle pulse sequence.

12. The sensor as in claim 11 wherein the supplying a toggle pulse sequence comprises:
sampling the output prior to and subsequent to the toggle pulse sequence.

13. The sensor of claim 8 wherein the at least one sensing element comprises first, second, third, and fourth sensing elements configured as a Wheatstone bridge having a pair of voltage source terminals, and the at least one sensing element output terminal comprises a pair of output terminals for supplying the output, wherein the steps of supplying the first and second currents comprises supplying the first and second currents contiguous to each of the first, second, third, and fourth sensing elements.

14. The sensor of claim 13 wherein each of the first, second, third, and fourth sensing elements comprise a first, second, third, and fourth, magnetic tunnel junction array, respectively.

15. The sensor of claim 8 further comprising the step of ceasing the supply of the first current prior to supplying the second current.

16. A method of sensing a magnetic field in a device including at least one sensing element including a ferromagnetic sense layer, an unpinned synthetic antiferromagnetic reference layer, a tunnel barrier positioned between the ferromagnetic sense layer and the unpinned synthetic antiferromagnetic reference layer, and at least one sensing element output terminal, and first and second orthogonal current lines disposed near the at least one sensing element, the method comprising:
applying a first stabilization current to at least one of the first and second current lines;
sampling a first value at the at least one sensing element output terminal;
supplying a first toggle current to an input of the first current line;
supplying a second toggle current to an input of the second current line, the second toggle current partially overlapping in time the first toggle current, thereby causing a magnetic moments of the unpinned synthetic antiferromagnetic reference layer to reverse directions;
applying a second stabilization current to at least one of the first and second current lines, the second stabilization current being one of the same or different from the magnitude of the first stabilization current;
sampling a second value at the at least one sensing element output terminal;
determining the difference between the first and second sampled values; and
determining a measured magnetic field based on the determined difference.

17. The method of claim 16 wherein each of the at least one sensing element comprises a magnetic tunnel junction array.

18. The method of claim 16 wherein the at least one sensing element comprises:
first, second, third, and fourth sensing elements configured as a Wheatstone bridge having a pair of voltage source terminals; and
the at least one sensing element output terminal comprises:
a pair of output terminals for supplying the output.

19. The method of claim 18 wherein each of the first, second, third, and fourth sensing elements comprise a first, second, third, and fourth magnetic tunnel junction array.

* * * * *